United States Patent [19]
Frederick

[11] Patent Number: 5,760,584
[45] Date of Patent: Jun. 2, 1998

[54] SHIELD FOR MR SYSTEM RF COIL PROVIDED WITH MULTIPLE CAPACITIVE CHANNELS FOR RF CURRENT FLOW

[75] Inventor: Perry S. Frederick, Waukesha, Wis.

[73] Assignee: General Electric Company, Milwaukee, Wis.

[21] Appl. No.: 689,948

[22] Filed: Aug. 16, 1996

[51] Int. Cl.$^6$ .................................................. G01R 33/20
[52] U.S. Cl. .................................................. 324/318
[58] Field of Search .................. 335/301; 174/35 R, 174/35 MS; 324/300, 307, 309, 318

[56] References Cited

U.S. PATENT DOCUMENTS

| | | | |
|---|---|---|---|
| 4,871,969 | 10/1989 | Roemer et al. | 324/318 |
| 4,879,515 | 11/1989 | Roemer et al. | 324/318 |
| 5,381,093 | 1/1995 | Kawamoto | 324/318 |
| 5,680,046 | 10/1997 | Ferderick et al. | 324/318 |

*Primary Examiner*—Sandra L. O'Shea
*Assistant Examiner*—Michael Eisenberg
*Attorney, Agent, or Firm*—James O. Skarsten; John H. Pilarski

[57] ABSTRACT

An RF shield is provided to prevent coupling between the gradient coils and the RF coil of an MR imaging system, wherein the RF field rotates around the RF coil axis. The shield includes a number of coaxial conductive cylinders, and further includes a plurality of cylinders formed of dielectric material, each dielectric cylinder positioned between adjacent conductive cylinders. Each conductive cylinder is formed from sheets of copper, each sheet having a pattern of conductive loops formed therein, and each loop having an associated gap to prevent induction of eddy currents therein by gradient magnetic fields produced by the MR system gradient coils. The number of conductive cylinders, and the angular orientation thereof with respect to one another, are selected to provide a plurality of closed paths for RF image current induced by the RF field, wherein respective closed paths are established by capacitive coupling between a given conductive loop of a given conductive cylinder, and conductive loops in other of the conductive cylinders.

11 Claims, 4 Drawing Sheets

SHIELD FOR MR SYSTEM RF COIL PROVIDED WITH MULTIPLE CAPACITIVE CHANNELS FOR RF CURRENT FLOW

BACKGROUND OF THE INVENTION

The invention generally pertains to a laminated RF shield positioned between the RF coil and the gradient coils of a magnetic resonance (MR) imaging system. More particularly, the invention pertains to RF shields which are substantially transparent to gradient fields, while acting to prevent loss of RF energy to the gradient coils.

As is well known, an MR system requires an RF coil to generate the $B_1$ field, necessary to produce MR data. An MR system also requires a set of three gradient coils to spatially encode the MR data. Both the RF and gradient coils are positioned around the MR magnet bore, which receives the patient or other imaging subject. The gradient coils are typically positioned outside the RF coil, so that fields generated by the gradient coils must extend past the RF coil, in order to reach the magnet bore.

If coupling occurs between the RF and gradient coils, the gradient coils will absorb or "suck away" RF coil energy. This causes the Q, or quality factor, of the RF coil, as well as the signal-to-noise ratio thereof, to be significantly reduced. To prevent such absorption of RF coil power or energy, it has become common practice to place an RF shield between the RF coil and the gradient coils. From the standpoint of preventing RF coil power absorption, an ideal shield would be a cylinder of solid copper, or like conductive material, positioned between the RF and gradient coils. The RF field would induce image currents in the solid copper cylinder, which would serve to reflect the RF field so that it could not interact with the gradient coils. However, such a solid shield would also seriously attenuate gradient fields extending into the MR magnet bore.

Accordingly, the prior art has developed a shielding device known as the double sided shield for the magnetic resonance RF coil, exemplified, for example, by commonly assigned U.S. Pat. No. 4,879,515, issued Nov. 7, 1989 to Roemer et al. Such patent teaches an arrangement wherein a cylindrical shield, positioned between RF and gradient coils, comprises a conductor-dielectric-conductor laminate. Each conductive laminate layer comprises a sheet of copper or the like, having a pattern of conductive loops formed therein. The patterns for the two conductive layers are substantially similar, and the layers are respectively positioned so that their respective conductive loop patterns are in aligned relationship on opposite sides of the dielectric. Each conductive loop of the conductive layers has a cut or break formed therein, as a barrier to gradient induced eddy current flow. Thus, closed paths for current flow cannot be established on one of the conductive layers alone. Accordingly, neither conductive layer, by itself, can support an induced eddy current.

For RF frequencies, which are on the order of 10–100 MHz, the laminated RF shield functions as a low impedance capacitor. Accordingly, the RF field may induce image currents in the shield, wherein a current flow path includes a conductive loop, or portion thereof, in each of the conductive shield layers. Current is capacitively transferred between such loops through the dielectric. However, currents at gradient field frequencies, which are on the order of 1–10 KHz, will not be transferred across the dielectric. Since the breaks in respective conductive loops prevent current flow around a single conductive layer, eddy currents cannot be supported in the RF shield at such gradient field frequencies. Accordingly, the shield is transparent to the gradient fields.

In recent years, there has been increasing interest in faster MR imaging techniques, such as high speed imaging (HSI) and echo-planar imaging (EPI), which employ substantially higher gradient pulse speeds and amplification levels. Also, it has become increasingly common to use RF coils which produce quadrature RF fields. Accordingly, it has been found necessary to develop more effective RF shields. Such developments are exemplified by commonly assigned U.S. patent application Ser. No. 08/286,366, currently pending, filed Aug. 5, 1994 by Roemer and Perry S. Frederick, the inventor named herein. This application teaches a modified shield arrangement, wherein the two conductive layers of the shield described above are oriented at ninety degrees with respect to each other. Also, the cuts or breaks in respective loops of the two conductive layers are selectively staggered.

Notwithstanding the improvements provided by the invention of such application, RF shielding requirements continue to become ever more demanding. For example, there is now interest in expanding the bore diameter of a common MR system from 55 centimeters to 60 centimeters. This requires moving the RF coil closer to the gradient coils. Accordingly, RF field coupling becomes greater, so that RF shielding is even more difficult. Moreover, in the RF shielding prior art, the conductive loops formed on respective conductive sheets are intended to align with the currents which are induced therein by the RF field, when the RF field is at a specific angular orientation with respect to the shield. However, while the RF field rotates about the RF coil axis, the conductive loop patterns remain static, or spatially fixed. As a result, the RF shield tends to become less effective at RF field orientations other than the specific orientation. Thus, shielding effectiveness is not symmetrical around the RF coil.

SUMMARY OF THE INVENTION

The present invention is generally directed to RF shield apparatus for preventing coupling between the gradient coils and RF coil of an MR imaging system, wherein the RF field rotates around the axis of the RF coil. The apparatus includes a specified number of coaxial conductive cylinders, and further includes cylinders formed of selected dielectric material respectively positioned between adjacent REF shielding cylinders, to form a laminated structure. Each of the conductive cylinders comprises two opposing sheets of electrically conductive material, wherein each of the sheets is cut or etched to form a pattern of concentric conductive loops. Each loop has a gap or break formed across it to prevent induction of eddy currents therein by gradient magnetic fields produced by respective gradient coils. The number of conductive cylinders, and the angular orientations thereof with respect to one another, are selected to provide a plurality of closed paths for RF current induced by the RF field, wherein respective closed paths are established by capacitive coupling between a given conductive loop of a given conductive cylinder, and conductive loops in different conductive cylinders other than the given cylinder.

In a preferred embodiment, the conductive loops formed in the conductive sheets of a specified conductive cylinder substantially align with the current flow paths of image currents which are induced in the specified conductive cylinder by the RF field, when the RF field is at a specified angular position in its rotation around the RF coil axis. The conductive cylinders comprise first and second cylinder pairs, wherein each pair comprises an inner and an outer conductive cylinder, the inner cylinder of each pair being positioned at an angular orientation of ninety degrees with respect to the outer cylinder thereof. Preferably, the outer conductive cylinder of the first pair is positioned at an angular orientation of 45 degrees with respect to the outer cylinder of the second pair, and at an orientation of 135 degrees with respect to the inner cylinder. Also, the conductive loop patterns formed in respective conductive sheets are substantially similar for all the conductive cylinders.

OBJECTS OF THE INVENTION

An object of the invention is to provide an improved RF shield for an MR imaging system, wherein shielding effectiveness remains substantially uniform as the RF field rotates about the axis of the RF coil of the system.

Another object is to provide an improved RF shield for an MR system, wherein the MR magnet bore is expanded so that the spacing between the RF and gradient coils is necessarily decreased.

Another object is to provide an RF shield of the above type comprising a plurality of coaxial conductive cylinders, wherein an RF induced image current flowing on one of the conductive cylinders can be capacitively coupled to each of a plurality of other conductive cylinders.

Another object is to substantially reduce uninterrupted copper conductor areas so as to not support gradient induced eddy currents associated with faster gradient slew rates and strengths.

These and other objects of the invention will become more readily apparent from the ensuing specification, taken together with the accompanying drawings.

DETAILED DESCRIPTION OF THE PREFERRED EMBODIMENT

Figure 1:
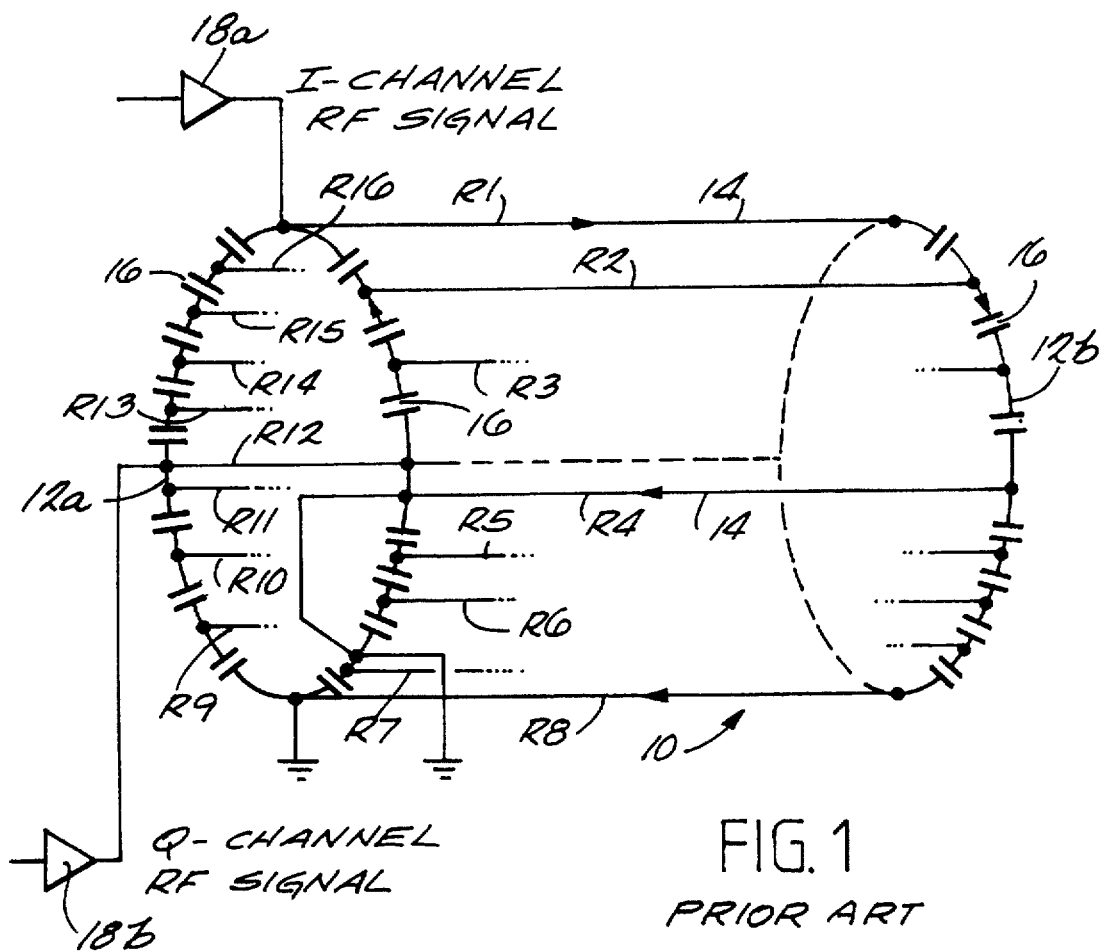
FIG. 1 is a schematic view showing an RF bird cage coil.

Referring to FIG. 1, there is shown an RF coil 10, of a type well known in the art as a bird cage coil. Coils of such type are widely used to produce RF fields for MR imaging systems. Generally, coil 10 comprises segmented end rings 12a and 12b, with linear conductors or runs 14 extending therebetween. Coil 10 shows sixteen runs 14, numbered R1–R16 (some runs shown only in part), although a different number of runs could be used, depending on specific application. A capacitor 16 is connected in series in each segment of rings 12a and 12b, as shown in FIG. 1.

In operation, an RF amplifier 18a applies a sinusoidal I-channel RF signal to the run R1 for a specified time interval, e.g., 10 milliseconds. This causes a current distribution to flow, the maximum of which flows at a time t through a path comprising run R1, run R8 oriented at 180 degrees around coil 10 from run R1, and portions of rings 12a and 12b. Such current flow generates the I-component of an RF magnetic field within bird cage coil 10.

Simultaneously, a Q-channel sinusoidal RF signal is applied by an RF amplifier 18b to run R12, which is oriented around end rings 12a and 12b from run R1 at an angle of 270 degrees, or −90 degrees. The Q-channel RF signal is identical to the I-channel signal, except that the Q-channel signal is delayed in phase by ninety degrees. The Q-channel signal causes a current distribution to flow, the maximum of which flows at a time t+T/4(where T=period of RF excitation frequency) through runs R12 and R4, likewise oriented 180 degrees from each other, to generate the Q-component for the RF field. The time variant I- and Q-field components combine to provide the rotating RF or $B_1$ field for MR imaging.

Following the specified time interval, the I- channel signal is successively applied to runs R2–R16, during corresponding successive time intervals. Accordingly, the I-channel magnetic field component, generated by the successive energizations, is rotated around the axis of RF bird cage coil 10. The Q-channel signal is likewise applied to successive runs, to rotate the Q-component of the RF magnetic field around the RF coil axis, the ninety degree phase angle between the I- and Q- components being maintained. Since the rotating I- and Q-field components collectively comprise the $B_1$ or RF magnetic field, such field rotates around the RF coil axis in a plane orthogonal thereto.

Figure 2:
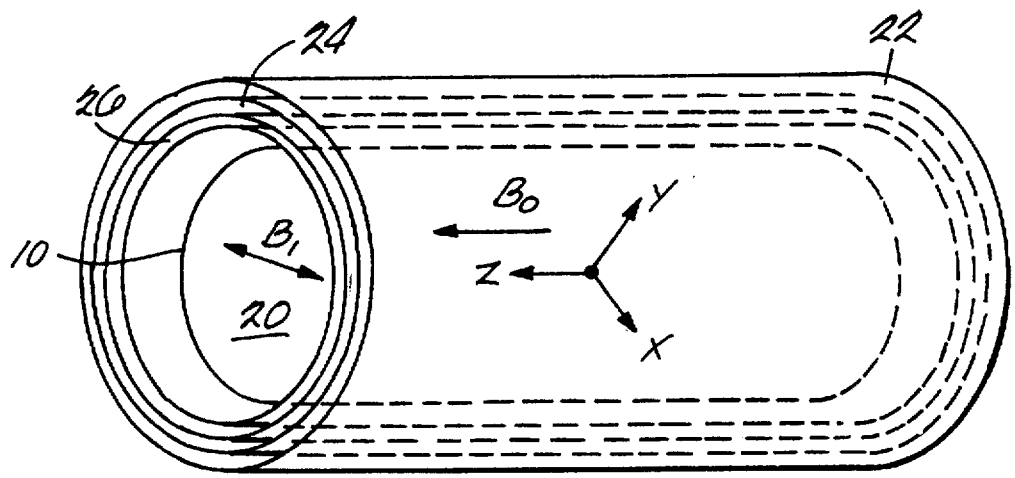
FIG. 2 is a simplified perspective view showing an embodiment of the invention positioned with respect to other components of an MR imaging system.

Referring to FIG. 2, there is shown RF coil 10 positioned within the bore 20 of an MR main magnet 22. Magnet 22 may comprise a superconductive, permanent or other magnet, of a type well known in the art to produce a static $B_0$ magnetic field as required for MR imaging. RF coil 10 is in coaxial relationship with bore 20, and $B_0$ is directed along the bore axis, in orthogonal relationship with the $B_1$ field produced by RF coil 10.

FIG. 2 further shows a gradient coil assembly 24, comprising a hollow cylindrical structure likewise positioned in bore 20, around RF coil 10. As is well known, gradient coil assembly 24 contains coils (not shown) for generating respective X-,Y-, and Z-gradient fields within magnet bore 20 which are required for MR imaging. The gradient fields are respectively oriented relative to X-,Y-, Z- coordinate axes, wherein the Z-axis is aligned along the axis of bore 20. As stated above, it is very important to prevent the RF field from coupling with the gradient coils of assembly 24. At the same time, the gradient fields must be able to extend into bore 20, past RF coil 10. Accordingly, an RF shield 26, constructed in accordance with the invention, is placed between RF coil 10 and the gradient coils of assembly 24.

Figure 4:
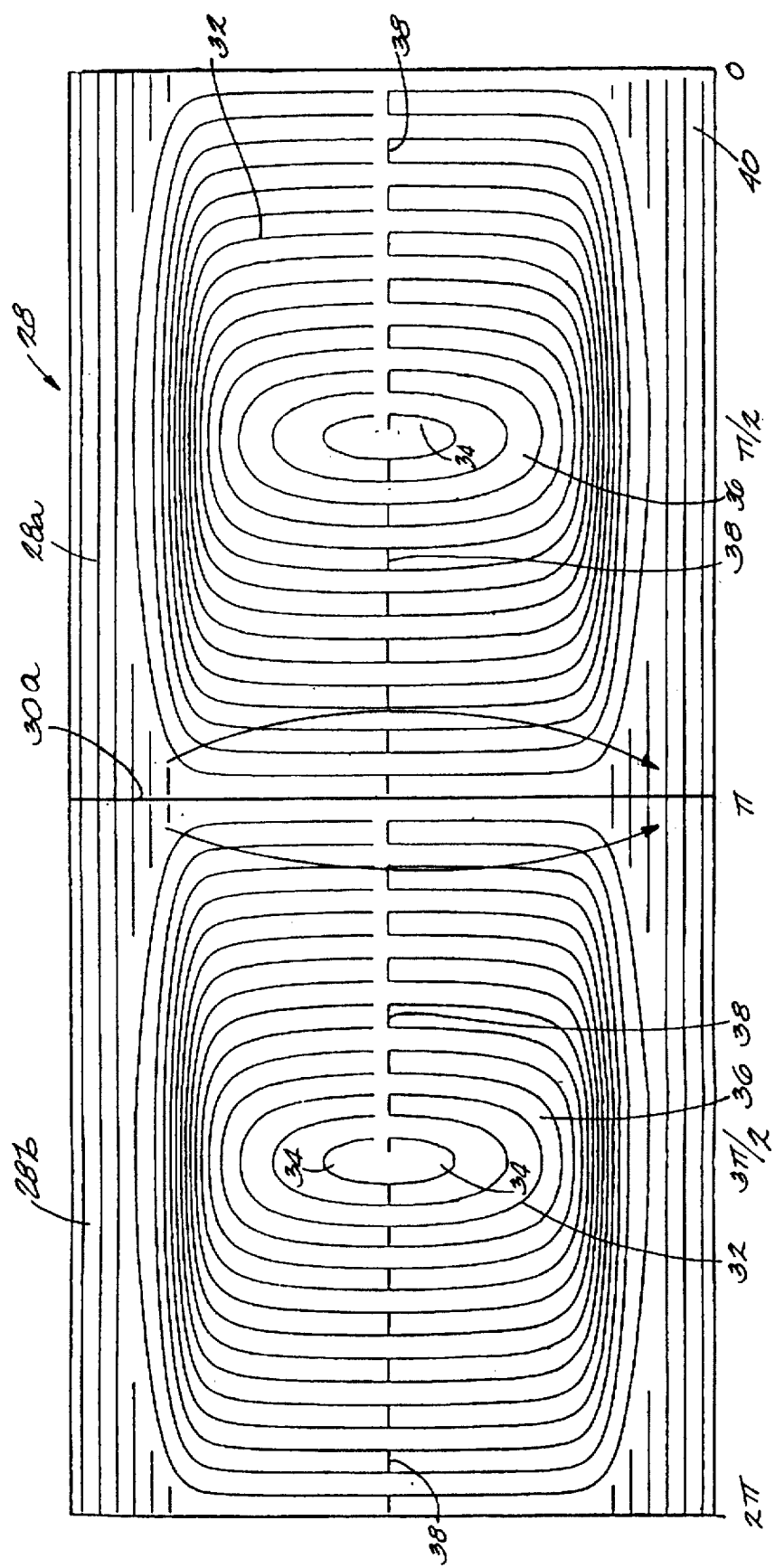
FIG. 4 is a perspective view showing the outer cylindrical layer of the embodiment shown in FIGS. 2 and 3, wherein such layer has been flattened for purposes of illustration.
Figure 3:
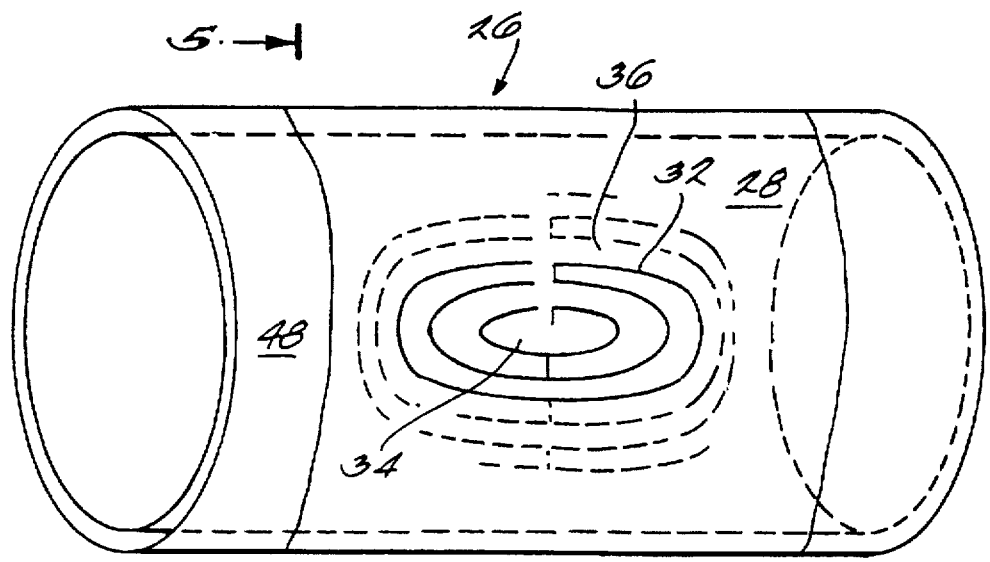
FIG. 3 is a perspective view showing the embodiment of FIG. 2 having a portion broken away.
Figure 5:
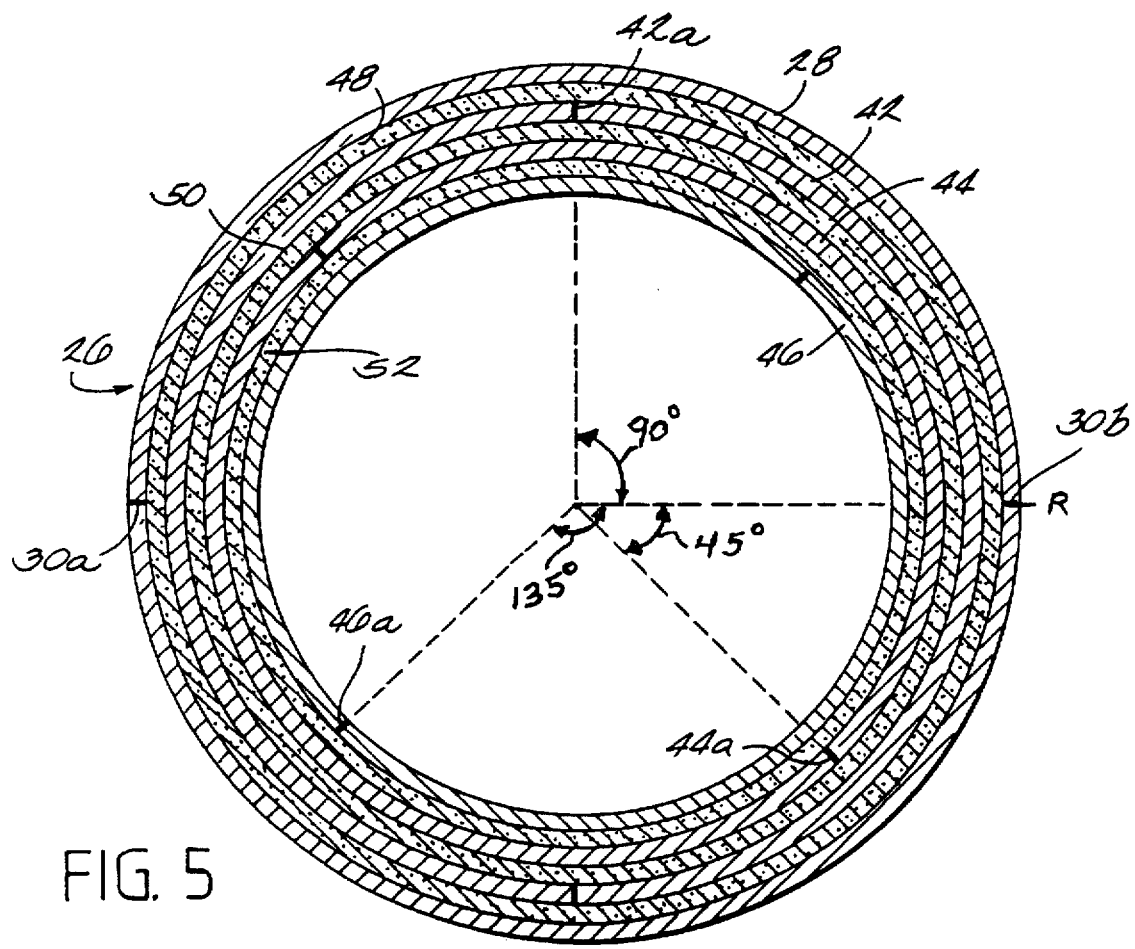
FIG. 5 is a sectional view taken along line 5—5 of FIG. 3.

The RF shield 26 is best understood by considering FIGS. 3–5 collectively. FIG. 3 shows a shield 26 comprising a laminated or layered structure, having the form of a hollow cylinder. The outer layer comprises a cylindrical conductive layer 28, shown in detail in FIG. 4.

Referring to FIG. 4, there is shown conductive cylinder 28 comprising two sheets of copper 28a and 28b. While the sheets are shown in a flattened condition in FIG. 4, they are each formable into a half-cylinder, and can be positioned together to form the complete cylinder layer 28. Sheets 28a and 28b are respectively positioned to leave narrow gaps or spaces between proximate common edges. That is, the leftward and rightward edges of sheets 28a and 28b, respectively, as viewed in FIG. 4, are closely spaced apart by a gap 30a. When the complete cylinder 28 is formed, the rightward and leftward edges of sheets 28a and 28b, respectively, as viewed in FIG. 4, would likewise be positioned close together with a narrow gap 30b(shown in FIG. 5,) therebetween. The gaps 30a and 30b serve to electrically isolate half cylinder 28a and 28b from each other. Techniques for fabricating the sheets 28a and 28b, as well as other components of RF shield 26, are described hereinafter.

FIG. 4 further shows a pattern of curved lines or contours 32 etched or cut through each of the sheets 28a and 28b. It is to be understood that gradient induced currents cannot flow across the contours 32. Accordingly, the contoured lines 32 define a pad 34 in the center of each sheet, and a pattern of concentric conductive loops 36 surrounding each pad. The approach for designing the pattern of conductive loops 36 is discussed hereinafter. The pad 34 and loops 36 together cover most of the surface area of each of the sheets 28a and 28b. FIG. 4 also shows a line 38 cut or etched across each loop 36, which comprises a barrier to gradient induced current flow in like manner with the contours 32. Thus, none of the loops 36 of either copper sheet 28a or 28b can provide an uninterrupted low frequency current flow path which lies exclusively on or along conductive cylinder 28. It will be seen from FIG. 4 that for two adjacent loops 36, their respective current barrier lines 38 are placed on opposing sides of their associated central pad 34.

Referring further to FIG. 4, there is shown a pattern of straight current barrier lines 40, which are cut or etched through the surface regions of sheets 28a and 28b which are respectively not included within contour lines 32. Thus, there is insufficient area on either sheet 28a or 28b to support a closed path for the flow of gradient induced eddy currents which would be of significant size. Accordingly, the conductive sheets of conductive layer 28 are substantially transparent to the gradient fields generated by assembly 24. Respective copper sheets 28a and 28b have a thickness on the order of 1.4 mils. The widths of lines 32, 38, and 40 are respectively on the order of 20 mils. Since the sheets of conductive cylinder 28 are formed into a cylinder, it is useful to select a zero degree reference position for cylinder 28 to identify the angular orientation thereof with respect to associated structure. Usefully, the rightward edge of sheet 28a , as viewed in FIG. 4, is selected as such reference position The lower edge of layer 28, which comprises the circumference of the conductive cylinder 28, is marked in radians at intervals of Π/2, or ninety degrees.

Referring to FIG. 5, there is shown laminated shield 26 comprising cylindrical conductive layers 42, 44 and 46, in addition to conductive cylinder 28, such conductive cylinders being in coaxial relationship with one another and with cylinder 28. There are further shown cylinders 48, 50 and 52, each formed of a dielectric material and respectively positioned between adjacent conductive cylinders in coaxial relationship therewith. Each of the dielectric cylinders may be formed, for example, from material such as polytetrafluorethylene fiberglass laminate manufactured by Allied Signal Corporation, having a thickness on the order of 0.0030 inches and a dielectric constant on the order of 2.57.

Each of the conductive cylinders 42, 44 and 46 is substantially identical in construction to conductive cylinder 28, except for slight reductions in scale to accommodate their respective smaller diameters. Also, cut lines 38 for the cylinder 42 are offset by one loop 36 location with respect to cylinder 28. In like manner, cut lines 38 for the cylinder 46 are offset by one loop location 36 with respect to cylinder 44. Thus, each cylinder 42, 44 and 46 comprises two half-cylinder copper sheets (not shown) such as 28a and 28b. Each such sheet is provided with contour lines 32 to form a pattern of conductive loops 36 similar to the loop patterns of sheets 28a and 28b, as well as lines similar or identical to the lines 38 and 40 thereof. Moreover, respective spacings or gaps 30a and 30b are provided between the two copper half-cylinders of each conductive cylinder 42, 44, and 46. As with cylinder 28, the gap 30b is selected as a zero degree reference position for each of the other conductive cylinders, to indicate their angular orientation relative to one another, as viewed in FIG. 5. Such reference positions for the conductive cylinders 42, 44 and 46 are respectively represented in FIG. 5 as 42a, 44a, and 46a.

As is further shown in FIG. 5, the respective angular orientations of the conductive cylinders 28 and 42–46 relative to a common angular reference position are different from one another. Thus, FIG. 5 shows the zero degree reference position of the outermost conductive layer 28 aligned with a common angular reference position R, and the zero degree reference position 42a of layer 42 is oriented at ninety degrees from reference position R. The zero degree reference positions 44a and 46a of conductive cylinders 44 and 46 are oriented at 45 degrees and 135 degrees, respectively, with respect to position R. Thus, cylinders 28 and 42 are oriented at ninety degrees with respect to one another, and cylinders 44 and 46 are likewise oriented at ninety degrees with respect to one another.

The RF shield 26 is usefully fabricated by placing a sheet of dielectric material of the type described above between two sheets of copper, each twice the size of sheet 28a or 28b. Such structure is subjected to substantial pressure and heat, whereupon the dielectric material will form an adhesive bond with both copper sheets. One of the copper sheets is then etched or cut to form contour lines 32, current barrier lines 38 and straight lines 40, and to thereby form the patterns for sheets 28a and 28b, as described above. The gap 30a is also cut through the copper sheet, to divide it into the two electrically isolated half-cylinders 28a and 28b.

Similar patterns, but shifted by Π/2 radians, are etched on the copper sheet bonded to the opposing side of the dielectric material, in order to form two half-cylinder sheets for conductive cylinder 42. Opposing ends of the combined sheets are brought together to form a cylindrical structure, the dielectric material between the cylinders 28 and 42 being thereby formed into the dielectric cylinder 48.

Through a similar process, a layered cylindrical structure comprising conductive cylinders 44 and 46 and dielectric cylinder 52 is formed. The two cylindrical structures are then combined, as described above and with dielectric cylinder 50 positioned therebetween, to form the complete shield 26. The shield 26 is positioned around the cylindrical inner wall of gradient coil assembly 24, and may be held in place by means of straps (not shown).

To more fully appreciate the invention and the benefits thereof, the particular design or pattern for conductive loops 36 of the copper sheets 28a and 28b, as well as the sheets of the other conductive cylinders, shall now be described. Referring again to FIG. 1, shield 26 is oriented with respect to RF bird cage coil 10 so that the zero degree reference position of conductor 28 is at a prescribed angle with respect to run R1 of coil 10. For such orientation, it is first considered that if copper sheets 28a and 28b had no lines 32 or 38 etched or cut therein, RF image currents having a specified pattern of current flow paths would be induced in the respective sheets 28a and 28b, when the RF I-channel signal was applied to run R1, as described above. Accordingly, the contour lines 32 are cut in the sheets to form conductive loops 36 which substantially align with such current flow paths. Thus, induced RF image currents flowing through respective conductive loops 36 will cause sheets 28a and 28b to function as a nearly perfect reflector and therefore as a perfect shield, to the I-component RF magnetic field generated by the energization of run R1.

As indicated above, induced image currents will flow through respective loops 36 at RF frequencies, notwithstanding the current barrier lines 38. At RF frequencies, capacitive coupling occurs between conductive cylinder 28 and the adjacent conductive cylinder 42. Thus, current is capacitively transferred between conductive loop 36 of cylinder 28 and respectively corresponding loops of conductive cylinder 42, thus effectively short circuiting the barrier lines 38 at RF frequencies.

As stated above, conductive cylinder 42, comprising copper sheets which are substantially the same as sheets 28a and 28b, is oriented at an angle of ninety degrees with respect to conductive cylinder 28. Accordingly, conductive cylinder 42 has the same angular orientation with respect to run R12 as cylinder 28 has to run R1. Thus, when the Q-channel RF signal is applied to run R12 simultaneously with application of the I-channel signal to run R1, the conductive cylinder 42 operates as a near-perfect reflector of the Q-component of the RF magnetic field. Thus, conductive cylinders 28 and 42 provide very effective shielding for the total RF field. However, as also stated above, the RF field rotates as the I- and Q- channel RF signals are successively applied to runs R2 and R3, and to runs R13 and R14, respectively. As the magnetic field rotates, the effectiveness of a shield comprising only cylinders 28 and 42 diminishes. This is because cylinders 28 and 42 remain spatially fixed as the RF field rotates, so that the match between their conductive loop patterns and the ideal patterns for perfect RF field reflection decreases.

The provision of conductive cylinders 44 and 46 in shield 26 has successfully overcome the above deficiency. This has been achieved by providing current flowing in a conductive loop, such as a loop 36 of sheet 28a or 28b, with multiple flow paths, rather than a single path. The multiple flow paths provide additional image current channels which are more effective in reflecting the RF magnetic field, thereby preserving the quality factor (Q) of the RF coil, regardless of the field orientation of the RF field in the X-Y plane. The multiple flow paths provided by the invention are illustrated in FIG. 6.

Figure 6A:
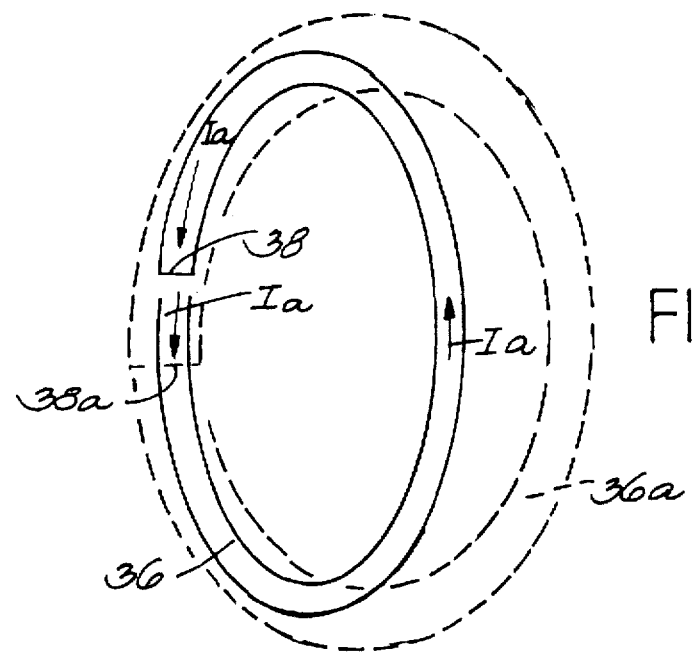
FIG. 6 is a simplified schematic representation for illustrating principles of the invention.

Referring to FIG. 6A, there is shown a conductive loop 36 of sheet 28a overlaying a conductive loop 36a of conductive cylinder 44, the two loops being offset from one another by 45 degrees or Π/4 radians. Thus, an RF image current $I_a$ flowing through conductive loop 36 is capacitively coupled to conductive loop 36a, to form a first current flow path comprising both loops 36 and 36a, and thereby passing around the current barrier line 38 in loop 36, as well as the current barrier line 38a in conductive loop 36a.

Figure 6B:
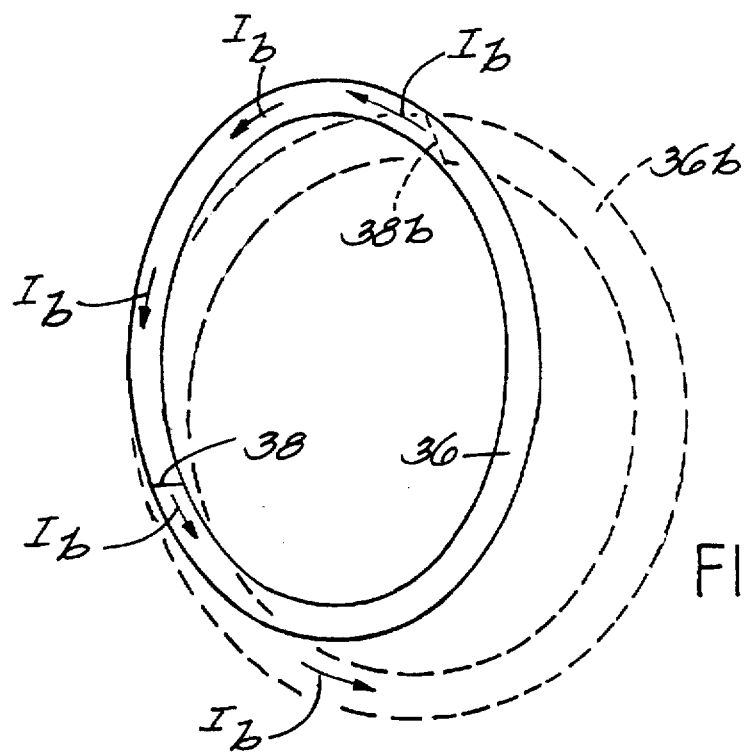

Similarly, FIG. 6B shows the same conductive loop 36 of sheet 28a overlaying a conductive loop 36b of conductive cylinder 46, the two loops being offset from one another by 135 degrees or 3 Π/4 radians. Image current $I_b$ flowing through conductive loop 36 is capacitively coupled to conductive loop 36b to form a second current flow path comprising both loops 36 and 36b, whereby the current $I_b$ passes around both the current barrier line 38, loop 36, and the current barrier line 38b in conductive loop 36b.

Other modifications and variations of the present invention are possible in light of the above teachings. It is therefore to be understood that within the scope of the disclosed concept, the invention may be practiced otherwise than as specifically described.

What is claimed is:

1. In an MR imaging system having an RF coil and one or more gradient coils, apparatus for shielding the gradient coils from an RF field generated by the RF coil which rotates around the axis thereof, said apparatus comprising:

an arrangement comprising a specified number of conductive cylinders in spaced-apart coaxial relationship;

a cylinder formed of selected dielectric material respectively positioned in each space lying between every two of said conductive cylinders which are adjacent to each other in said arrangement;

a pattern of conductive loops being formed in each of said conductive cylinders, each loop having an associated gap provided as a barrier to current flow; and said specified number of said conductive cylinders, and their respective angular orientations relative to one another, are selected to provide a plurality of closed paths for RF current induced by the RF field, wherein respective closed paths are established by capacitive coupling between a given conductive loop of a given conductive cylinder, and conductive loops of each of a plurality of other of said conductive cylinders.

2. The apparatus of claim 1 wherein:

said apparatus comprises four of said conductive cylinders and three of said dielectric cylinders; and respective closed paths are established by capacitive coupling between a conductive loop of said given conductive cylinder, and conductive loops of each of the other three of said conductive cylinders.

3. The apparatus of claim 1 wherein:

said conductive cylinders comprise first and second cylinder pairs, each of said pairs comprising an inner and an outer cylinder, the cylinders of said second pair lying within the cylinders of said first pair; and said dielectric cylinders are respectively positioned between the two conductive cylinders of each of said pairs, and also between the inner cylinder of said first pair and the outer cylinder of said second pair.

4. The apparatus of claim 3 wherein:

the inner cylinder of each of said pairs is positioned at an angular orientation of ninety degrees relative to the outer cylinder thereof; and the outer conductive cylinder of said first pair is positioned at an angular orientation on the order of 45 degrees with respect to the outer cylinder of said second pair, and at an angle on the order of 135 degrees with respect to the inner cylinder thereof.

5. The apparatus of claim 4 wherein:

said conductive and dielectric cylinders are collectively joined to form a laminated RF shield structure.

6. The apparatus of claim 5 wherein:

said RF field comprises two quadrature components.

7. The apparatus of claim 1 wherein:

each of said conductive cylinders comprises two opposing sheets of electrically conductive material; and the conductive loops formed in the sheets of a specified conductive cylinder substantially align with respective flow paths of image currents induced therein by said RF field when said RF field is at a specified angular position in its rotation around said RF coil axis.

8. The apparatus of claim 7, wherein:

said RF coil comprises a bird cage coil.

9. The apparatus of claim 7 wherein:

each of said sheets is provided with a central pad and with a concentric pattern of said conductive loops surrounding the pad, one of said gaps, comprising a cut line, being formed across each of said loops to prevent gradient current from flowing therearound; and the cut lines of two adjacent conductive loops formed in a given one of said sheets are placed on opposing sides of the central pad of said given sheet.

10. The apparatus of claim 9 wherein:

respective cut lines of one of said conductive cylinders are offset by one loop location with respect to another conductive cylinder adjacent thereto in said arrangement.

11. The apparatus of claim 10 wherein:

the central pad and respective conductive loops of said given sheet are each electrically connected to a common conductive area formed in said given sheet.

\* \* \* \* \*